(12) United States Patent
Terzioglu et al.

(10) Patent No.: US 8,599,597 B2
(45) Date of Patent: Dec. 3, 2013

(54) CIRCUITS CONFIGURED TO REMAIN IN A NON-PROGRAM STATE DURING A POWER-DOWN EVENT

(75) Inventors: Esin Terzioglu, San Diego, CA (US); Gregory A. Uvieghara, San Diego, CA (US); Mehdi H. Sani, San Diego, CA (US); Anil Kota, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 60 days.

(21) Appl. No.: 13/465,132

(22) Filed: May 7, 2012

(65) Prior Publication Data

US 2013/0294139 A1 Nov. 7, 2013

(51) Int. Cl.
*G11C 17/00* (2006.01)
*G11C 5/14* (2006.01)

(52) U.S. Cl.
USPC ................ 365/94; 365/96; 365/104; 365/226

(58) Field of Classification Search
USPC .......................................................... 365/94
See application file for complete search history.

(56) References Cited

U.S. PATENT DOCUMENTS

| | | | |
|---|---|---|---|
| 4,905,197 A | 2/1990 | Urai | |
| 5,274,827 A | 12/1993 | Haggerty et al. | |
| 6,552,934 B2 | 4/2003 | Roohparvar | |
| 6,822,899 B1 | 11/2004 | Boulos et al. | |
| 7,355,878 B1 * | 4/2008 | Hubbard | 365/94 |
| 7,881,129 B2 | 2/2011 | Park et al. | |
| 7,924,598 B2 * | 4/2011 | Hase et al. | 365/100 |
| 8,014,217 B2 | 9/2011 | Kunst | |
| 8,107,273 B1 | 1/2012 | Hollmer et al. | |
| 8,184,488 B2 * | 5/2012 | May et al. | 365/189.09 |
| 2008/0068910 A1 | 3/2008 | Jao et al. | |

OTHER PUBLICATIONS

Partial International Search Report—PCT/US2013/039952—ISA/EPO—Jul. 24, 2013.

* cited by examiner

*Primary Examiner* — Son Mai
(74) *Attorney, Agent, or Firm* — Sam Talpalatsky; Nicholas J. Pauley; Joseph Agusta

(57) ABSTRACT

In a particular embodiment, an apparatus includes a one-time programmable (OTP) memory circuit configured to be responsive to a programming voltage. The OTP memory circuit includes an OTP memory array including OTP memory cells, a first power switch configured to decouple the OTP memory array from the programming voltage, and a second power switch configured to decouple a subset of the OTP memory cells from the programming voltage.

40 Claims, 6 Drawing Sheets

CIRCUITS CONFIGURED TO REMAIN IN A NON-PROGRAM STATE DURING A POWER-DOWN EVENT

I. FIELD

The present disclosure is generally related to circuits configured to remain in a non-program state during a power-down event.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process instructions, such as a web browser application that can be used to access the Internet.

Memories, such as a memory within a wireless telephone or other electronic device, may store instructions in addition to other data. Some memories include memory cells that can be set to store data via a fuse or an anti-fuse. An example of such a memory is a one-time programmable (OTP) memory (e.g., a programmable read-only memory (PROM), a field programmable read-only memory (FPROM), or an OTP non-volatile memory (OTP NVM)). OTP memories may be manufactured "blank" and subsequently programmed, e.g., during a wafer manufacturing stage, during a final test stage, or during a system stage.

Because OTP memories may be configured to store information permanently, accidental programming may be irreversible and is therefore generally undesirable. Accidental programming may occur when an ungraceful power-down event occurs (e.g., an unexpected power failure or an unexpected power-down), which may corrupt data stored in the OTP memory cells (e.g., after such OTP memory cells have been written to) and which may unintentionally program OTP memory cells that have not yet been programmed. Unintentional programming of OTP memory cells may prevent devices from being updated (e.g., via firmware upgrades to be written to an OTP memory of a wireless communication device), which may be frustrating to users or even dangerous (e.g., where an OTP memory circuit is used in a medical device or in a vehicle).

III. SUMMARY

Because events at one-time programmable (OTP) memory cells may be irreversible, it is desirable to protect OTP memory cells against ungraceful power-down events. For OTP memories, an ungraceful power-down event may occur when a programming power supply (e.g., a power supply used to set fuses or anti-fuses) stays high while other power supplies fall, which may program or "stress" memory cells of the OTP memory. Conventional techniques may use a separate voltage regulator for the OTP memory array in order to isolate the OTP memory array from other device circuits. However, such a technique results in increased costs associated with multiple voltage regulators as well as increased circuit area. Other techniques may employ switches that are external to the OTP memory array, which may use more area, be more costly to fabricate, and may be less responsive to internal states of the OTP memory array by virtue of being external to the OTP memory array.

According to at least one embodiment, control circuitry protects OTP memory cells from being accidentally stressed or programmed when an ungraceful power-down event occurs. Further, in at least one embodiment, an OTP memory array is implemented without requiring a separate voltage regulator for the OTP memory cells. Thus, OTP memory cells may share the same voltage regulator with other devices, potentially reducing cost and complexity associated with multiple voltage regulators. According to at least one embodiment, an OTP memory circuit includes multiple internal power switches to decouple OTP memory cells from a programming voltage in response to a power-down event. The OTP memory circuit may include "redundant" protection of the memory cells (e.g., a global power switch in addition to one or more local power switches).

In a particular embodiment, an apparatus includes an OTP memory circuit configured to be responsive to a programming voltage. The OTP memory circuit includes an OTP memory array including OTP memory cells, a first power switch configured to decouple the OTP memory array from the programming voltage, and a second power switch configured to decouple a subset of the OTP memory cells from the programming voltage.

In another particular embodiment, a method includes maintaining an OTP memory circuit in a non-program state during a power-down event of a circuit that includes the OTP memory circuit. The method includes maintaining a flip-flop circuit in the non-program state until a value stored in the flip-flop circuit transitions from a first value to a second value in response to a fall in a first power supply of the flip-flop circuit. The method further includes maintaining a latch-based level shifter in the non-program state until a programming power supply of the latch-based level shifter falls from a high voltage to a low voltage. A power switch is maintained in an off state while either the flip-flop circuit or the latch-based level shifter is in the non-program state.

In another particular embodiment, an apparatus includes an OTP memory circuit configured to be responsive to a programming voltage. The OTP memory circuit includes an OTP memory array including OTP memory cells. The OTP memory circuit further includes means for decoupling the OTP memory array from the programming voltage and means for decoupling a subset of the OTP memory cells from the programming voltage.

One particular advantage provided by at least one of the disclosed embodiments is that ungraceful power-down events are less likely to stress or program OTP memory cells of an OTP memory circuit. For example, the OTP memory circuit may be configured to remain in a non-program state during power-down events (e.g., control circuitry may keep the OTP memory array in the non-program state). Further, because the OTP memory circuit is configured to remain in the non-program state during power-down events, a shared voltage regulator may be used to supply both the OTP memory circuit and at least one other device (e.g., a device that accesses data stored in the OTP memory array), which may reduce system cost and complexity associated with use of a separate voltage regulator for the OTP memory circuit.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
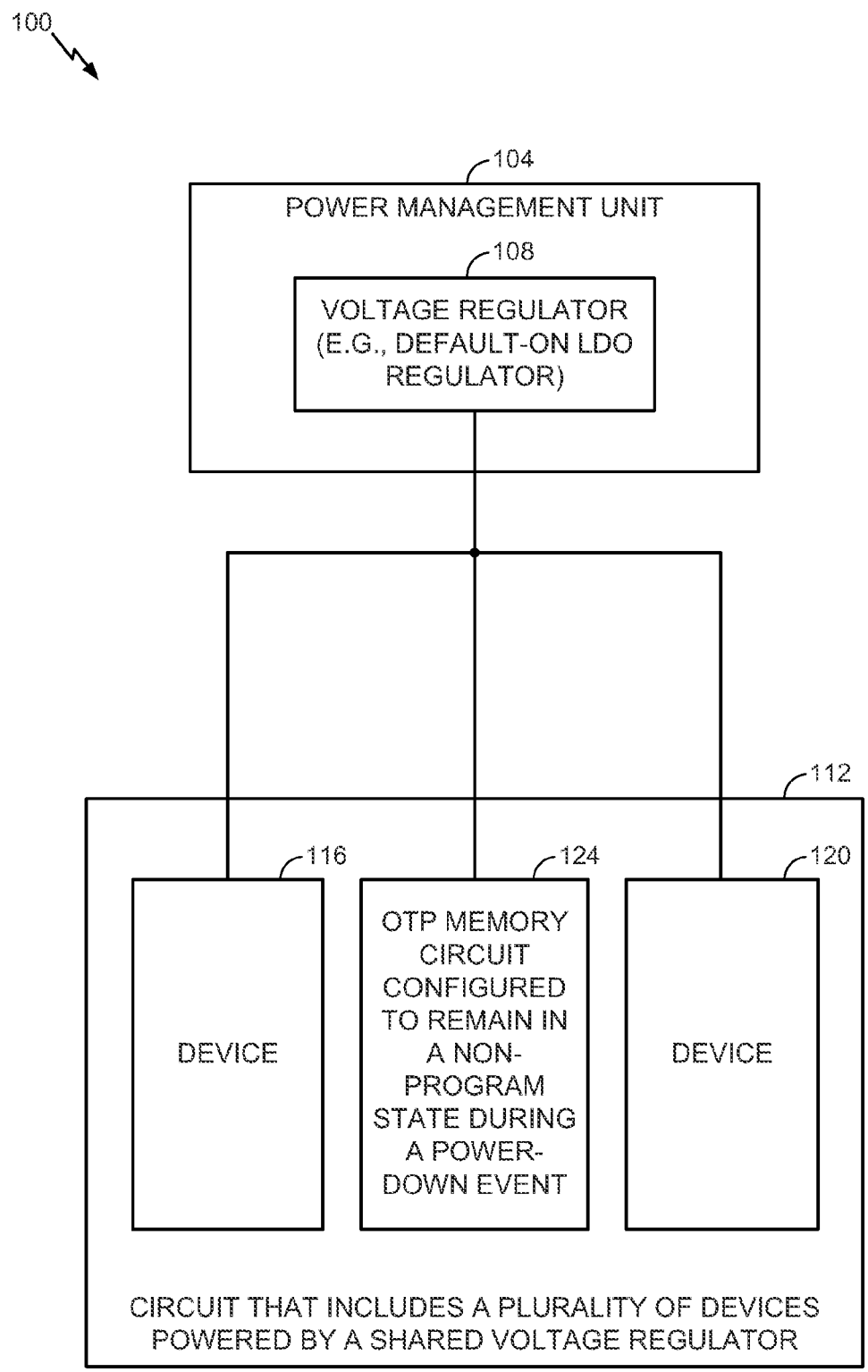
FIG. 1 depicts a block diagram of a particular illustrative embodiment of an apparatus that includes an OTP memory circuit configured to remain in a non-program state during a power-down event.

Referring to FIG. 1, a particular illustrative embodiment of an apparatus is disclosed and generally designated 100. The apparatus 100 may include a power management unit 104 that includes a voltage regulator 108 (e.g., a default-on, low-dropout (LDO) regulator). The apparatus 100 may include a circuit 112 that includes a one-time programmable (OTP) memory circuit 124 and at least one other device. For example, in the embodiment of FIG. 1, the circuit 112 includes a device 116, a device 120, and the OTP memory circuit 112. The OTP memory circuit 112 is configured to remain in a non-program state during a power-down event (e.g., during a power-down event of the circuit 112). The power-down event may be an ungraceful power-down event, such as an accidental or unexpected power-down event.

As shown in FIG. 1, a plurality of devices (e.g., the device 116, the device 120, and the OTP memory circuit 124) may be configured to share the voltage regulator 108. Utilizing a single voltage regulator for the plurality of devices of the circuit 112 may reduce cost and complexity associated with the apparatus 100. In addition, as explained further below, control logic of the OTP memory circuit 124 may provide protection of OTP memory cells against accidental stressing, enabling the plurality of devices of the circuit 112 to share the voltage regulator 108 without risking stressing of the OTP memory cells during a power-down event.

It should be appreciated that FIG. 1 is illustrative and that alternate embodiments are contemplated. For example, the power management unit 104 may be incorporated within any of the circuit 112, the device 116, the device 120, and the OTP memory circuit 124. Further, while the illustrative embodiment of FIG. 1 depicts that the circuit 112 includes three devices, according to alternate embodiments, the circuit 112 may include only the OTP memory circuit 124 or may include a different number of devices. Those of skill in the art will recognize other such modifications of the apparatus 100 of FIG. 1 as being within the scope of the present disclosure.

Figure 2:
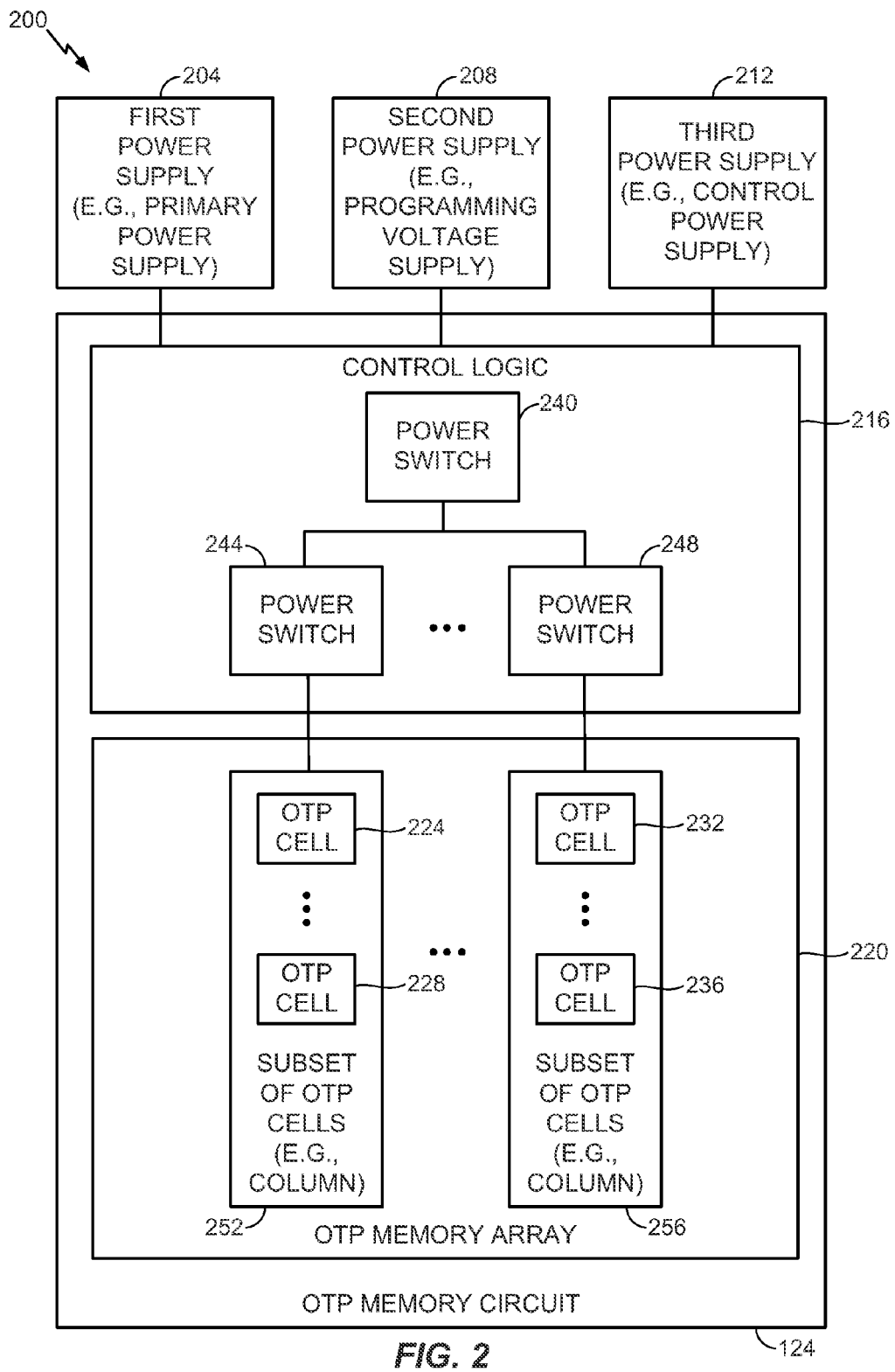
FIG. 2 depicts a block diagram of a particular illustrative embodiment of an OTP memory circuit, such as the OTP memory circuit of FIG. 1, and multiple power supplies that power the OTP memory circuit.

Referring to FIG. 2, a particular illustrative embodiment of an apparatus is disclosed and generally designed 200. The apparatus 200 includes a particular illustrative embodiment of the OTP memory circuit 124 of FIG. 1.

The OTP memory circuit 124 of FIG. 2 is responsive to a first power supply 204, to a second power supply 208, and to a third power supply 212. In at least one embodiment, the first power supply 204, the second power supply 208, and the third power supply 212 are generated by the power management unit 104 of FIG. 1 (e.g., via the voltage regulator 108 of FIG. 1). The first power supply 204 may supply a primary voltage (e.g., a voltage used to perform erase operations at memory cells of the OTP memory circuit 124), the second power supply 208 may supply a programming voltage (e.g., a voltage associated with determining bit values of OTP memory cells of the OTP memory circuit 124, such as by programming fuses or anti-fuses of OTP memory cells of the OTP memory circuit 124), and the third power supply 212 may supply a voltage $V_{DD}$ (e.g., a voltage used to power logic circuitry of the OTP memory circuit 124).

In the embodiment depicted in FIG. 2, the OTP memory circuit 124 includes control logic 216 and an OTP memory array 220. The OTP memory array 220 includes OTP memory cells, such as a first OTP memory cell 224, a second OTP memory cell 228, a third OTP memory cell 232, and an nth OTP memory cell 236. The control logic 216 may be configured to couple (e.g., electrically connect) and to decouple (e.g., electrically disconnect) one or more of the OTP memory cells to the second power supply 208. For example, according to at least one embodiment, the second power supply 208 supplies a programming voltage of the OTP memory circuit 124 (e.g., a voltage that is applied to circuitry of the OTP memory circuit 124 to set one or more fuses or anti-fuses included in one or more of the first OTP memory cell 224, the second OTP memory cell 228, the third OTP memory cell 232, and the nth OTP memory cell 236), and the control logic 216 is configured to decouple one or more of the OTP memory cells from the programming voltage in response to a power-down event.

The control logic 216 may include internal power switches that are configured to decouple one or more of the OTP memory cells from the second voltage 208 in response to a power-down event. For example, as depicted in FIG. 2, the control logic 216 may include a first power switch 240, a second power switch 244, and a kth power switch 248. The first power switch 240 may be coupled to the second power switch 244 and to the kth power switch 248. The second power switch 244 may be coupled to at least one OTP memory cell (e.g., to the first OTP memory cell 224) and the kth power switch 248 may be coupled to at least one OTP memory cell (e.g., to the third OTP memory cell 232).

In at least one embodiment, the first power switch 240 is a "global" power switch configured to decouple each of the OTP memory cells of the OTP memory array 220 from the second power supply 208 in response to a power-down event. In at least one embodiment, the second power switch 244 and the kth power switch 248 are "local" power switches configured to decouple respective subsets of OTP memory cells of the OTP memory array 220 (e.g., a first subset 252 and a jth subset 256, respectively) from the second power supply 208 in response to a power-down event. In at least one embodiment, the first subset 252 and the jth subset 256 are each a respective OTP cell column of the OTP memory array 220.

It will be appreciated that the embodiment of the OTP memory circuit 124 depicted in FIG. 2 includes redundant internal protection (e.g., the first power switch 240, the second power switch 244, and the kth power switch 248) against conditions that could result in an accidental write or overwrite of OTP memory cells (e.g., a power-down event). Such internal protection may be within the same integrated circuit as other components of the OTP memory circuit 124, potentially reducing device cost and complexity.

As used herein, j, k, and n refer to integers greater than one. For example, although the particular embodiment of FIG. 2 depicts that the control logic 216 includes three power switches (i.e., the first power switch 240, the second power switch 244, and the kth power switch 248), according to alternate embodiments, the control logic 216 may include any number k of power switches, where k is any integer greater than one. As another example, although the particular embodiment of FIG. 2 depicts that the OTP memory array 220 includes four OTP memory cells (i.e., the first OTP memory cell 224, the second OTP memory cell 228, the third OTP memory cell 232, and the nth OTP memory cell 236), according to alternate embodiments, the OTP memory array 220 may include any number n of OTP memory cells, where n is any integer greater than one. As another example, although the particular embodiment of FIG. 2 depicts that the OTP memory array 220 includes two subsets of OTP memory cells (i.e., the first subset 252 and the jth subset 256), according to alternate embodiments, the OTP memory array 220 may include any number j of subsets (e.g., columns of OTP memory cells), where j is an integer greater than one.

Figure 3:
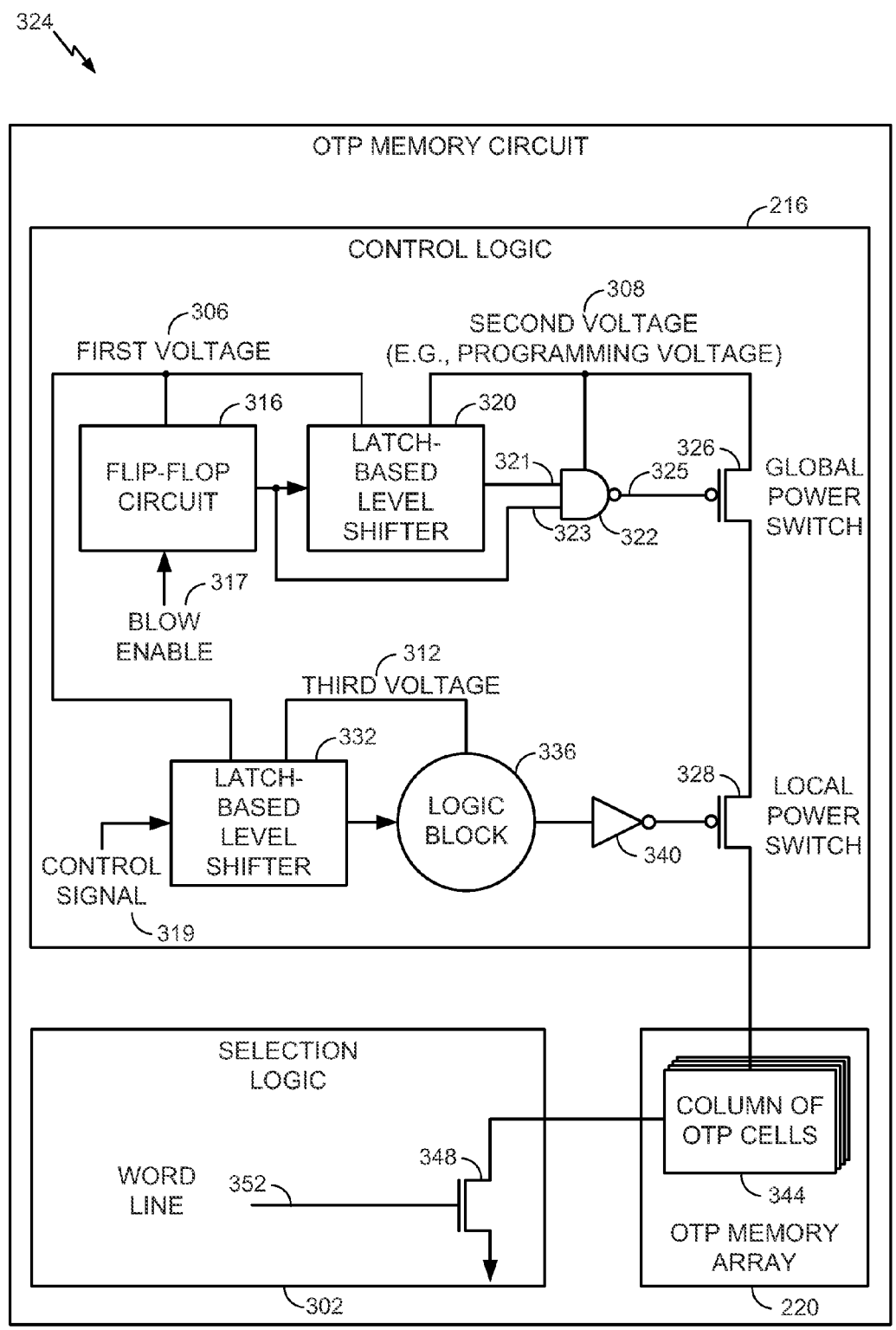
FIG. 3 depicts a diagram of a particular illustrative embodiment of an OTP memory circuit, such as the OTP memory circuit of FIG. 1.

Referring to FIG. 3, a particular illustrative embodiment of an OTP memory circuit is disclosed and generally designed 324. In at least one embodiment, the OTP memory circuit 324 of FIG. 3 corresponds to one or both of the OTP memory circuit 124 of FIG. 1 and the OTP memory circuit 124 of FIG. 2 (e.g., structure and operation of various components of the OTP memory circuit 324 of FIG. 3 may be described with reference to various components of the OTP memory circuit 124 of FIG. 1, the OTP memory circuit 124 of FIG. 2, or a combination thereof). In the embodiment depicted in FIG. 3, the OTP memory circuit 324 includes control logic 216, an OTP memory array 220, and selection logic 302.

The control logic 216 may include a flip-flop circuit 316, a first latch-based level shifter 320, one or more logic gates (e.g., a NAND gate 322), a global power switch 326, a local power switch 328, a second latch-based level shifter 332, a logic block 336, and an inverter 340. The NAND gate 322 may include (or be coupled to) a first input node 321, a second input node 323, and an output node 325.

Any of the flip-flop circuit 316, the first latch-based level shifter 320, and the second latch-based level shifter 332 may be responsive to (e.g., powered by) a first voltage 306. Any of the first latch-based level shifter 320, the NAND gate 322, the global power switch 326, and the local power switch 328 may be responsive to (e.g., powered by) a second voltage 308. Any of the second latch-based level shifter 332 and the logic block 336 may be responsive to (e.g., powered by) a third voltage 312.

In at least one embodiment, the flip-flop circuit 316 includes a flip-flop that is responsive to a "blow enable" input signal 317 associated with either a program state or a non-program state of the OTP memory circuit 324. For example, a first value of the blow enable input signal 317 may be associated with a program state and a second value of the blow enable input signal 317 may be associated with a non-program state. As explained further below, the control logic 216 may be configured to maintain the OTP memory array 220 in the non-program state if a power-down event occurs (e.g., an unexpected power-down event where an accidental OTP operation could occur) irrespective of the value of the blow enable input signal 317.

In at least one embodiment, the global power switch 326 corresponds to the first power switch 240 of FIG. 2. The local power switch 328 may correspond to the second power switch 244 of FIG. 2 or the kth power switch 248 of FIG. 2. As shown in FIG. 3, the global power switch 326 and the local power switch 328 may each include a p-type field effect transistor (PFET), although it should be appreciated that other suitable embodiments of the global power switch 326 and the local power switch 328 are within the scope of the present disclosure.

The OTP memory array 220 includes multiple OTP memory cells (e.g., memory cells that each include a fuse or an anti-fuse that has been programmed or is programmable to store a bit value). For example, the OTP memory array 220 may include multiple subsets of OTP memory cells (e.g., columns of OTP memory cells), such as a representative column 344 of OTP memory cells. According to at least one embodiment, each subset (e.g., the column 344) is responsive to the second voltage 308 when the global power switch 326 and the local power switch 328 are each gated with respective logically low signals (i.e., are gated "on").

The selection logic 302 may include logic configured to access (e.g., read data stored at) OTP memory cells of the OTP memory array 220. For example, the selection logic 302 may include an access transistor 348 responsive to a word line 352.

In at least one embodiment, the first voltage 306, the second voltage 308, and the third voltage 312 are generated by the first power supply 204, the second power supply 208, and the third power supply 212, respectively, of FIG. 2. Further, in at least one embodiment, the first voltage 306, the second voltage 308, and the third voltage 312 are generated by a voltage regulator that is shared by a plurality of devices (e.g., the voltage regulator 108 of FIG. 1).

In operation, while the OTP memory circuit 324 is receiving power, the OTP memory circuit 324 may be in a program state or in a non-program state (e.g., in a state where the OTP memory array 220 can be programmed or in a state where the OTP memory array 220 cannot be programmed, respectively). If a power-down event occurs while the OTP memory circuit 324 is in the program state, OTP memory cells of the OTP memory array 220 could potentially be accidentally programmed. For example, if during a power-down event the second voltage 308 remained logically high while the first voltage 306 fell to a logically low value and accidentally gated on a power switch, then an accidental OTP operation could occur. Accordingly, in at least one embodiment, the control logic 216 is configured to remain in the non-program state during a power-down event and is further configured to maintain the OTP memory array 220 in the non-program state during a power-down event.

To illustrate, suppose that a power-down event occurs at the OTP memory circuit 324. One or more of the first voltage 306, the second voltage 308, and the third voltage 312 may fall (e.g., may fall below respective first, second, and third thresholds). If the flip-flop circuit 316 stores a logical one value, then an output of the flip-flop circuit may be determined by (e.g., may correspond to) the level of the first voltage 306, since the flip-flop circuit 316 is powered by the first voltage 306. During a power-down event, the flip-flop circuit 316 may remain in a non-program state (e.g., may output a logical zero value) until the first voltage 306 falls below the first threshold (e.g., at which time the flip-flop circuit 316 may enter an "off" state).

The output of the flip-flop circuit 316 may be provided to the first latch-based level shifter 320, which generates an output that is level-shifted to the level of the second voltage

308. During a power-down event, the first latch-based level shifter 320 may remain in a non-program state (e.g., may output a logical zero value) until the second voltage 308 falls below the second threshold (e.g., at which time the first latch-based level shifter 320 may enter an "off" state). The output of the first latch-based level shifter 320 is provided to the first input node 321 of the NAND gate 322.

The output of the flip-flop circuit 316 may be further provided to the second input node 323 of the NAND gate 322, as shown in FIG. 2. In at least one embodiment, the second input node 323 functions as a "bypass" of the first latch-based level shifter 320. For example, in the embodiment of FIG. 2, even if the first latch-based level shifter 320 were to fail during a power-down event, a logically low signal at the second input node 323 still generates a logically high signal at output node 325, thereby gating off the global power switch 326. According to an alternate embodiment, the second input node 323 receives the first voltage 306 (i.e., instead of receiving the output of the flip-flop circuit 316). In either case, once the first voltage 306 has fallen below the first threshold, then the second input node 323 will receive a logically low signal, causing the global power switch 326 to be gated off. Hence, the global power switch 326 may remain in an off state while either the first latch-based level shifter 320 is in the non-program state (e.g., outputs a logically low value) or the flip-flop circuit 316 is in the non-program state (e.g., outputs a logically low value). As a result, in at least one embodiment, for the global power switch 326 to enter an "on" state, both the first latch-based level shifter 320 and the flip-flop circuit 316 output logically high values (e.g., during operation in a power-on, programming state) to enable programming of OTP memory cells.

The third latch-based level shifter 332 may receive control signals, such as a control signal 319, and may generate an output that is level-shifted according to the third voltage 312. The logic block 336 (e.g., logic associated with write operations to the OTP memory array 220) may be powered by the third voltage 312 and may be responsive to the output of the second latch-based level shifter 332. A signal (e.g., a control signal that controls write operations to OTP memory cells of the OTP memory array 220) output by the logic block 336 may be received and inverted by inverter 340. If the signal output by the logic block 336 is above a threshold (e.g., is logically high), then the inverter 340 may invert the signal to generate a logically low signal to gate on the local power switch 328. However, as one or more of the first voltage 306 and the third voltage 312 fall (e.g., in response to a power-down event), the signal output by the logic block 336 may not satisfy the threshold to be inverted low by the inverter 340, and accordingly the local power switch 328 may not be gated on, thus potentially preventing spurious signals generated during the power-down event from gating on the local power switch 328. Although the particular embodiment of FIG. 3 depicts that the logic block 336 is coupled to one column of OTP memory cells (i.e., the column 344), the logic block 336 may be coupled to multiple subsets (e.g., columns) of OTP memory cells, such as via respective multiple local power switches.

It will be appreciated that an OTP memory in accordance with FIG. 3 protects OTP memory cells from being accidentally stressed or programmed when an ungraceful power-down event occurs (e.g., via the NAND gate 322, which may be responsive to both the first voltage 306 and to the second voltage 308 and which may maintain the global power switch 326 gated off during a power-down event). Further, such protection may be achieved without utilizing a separate voltage regulator for the OTP memory and may be instead implemented with a shared voltage regulator. Still further, such protection may be implemented using circuitry internal to the OTP memory circuit. Accordingly, device cost, complexity, and area may be reduced as compared to techniques that utilize a separate voltage regulator or external power switches.

The OTP memory circuit 324 of FIG. 3 is described in terms of latch-based level shifters (i.e., the first latch-based level shifter 320 and the second latch-based level shifter 332), since for example a latch-based level shifter may latch in the value to be level-shifted and may therefore "hold" the latched-in value for a duration longer than non-latch-based level shifters. Accordingly, such a latch-based level shifter may advantageously maintain the latched-in value longer during a power-down event (e.g., enabling the latch-based level shifter to maintain a non-program state during a power-down event). However, it should be appreciated that non-latch-based level shifters may also be employed (depending on the particular application) and that such modifications are within the scope of the present disclosure.

Figure 4:
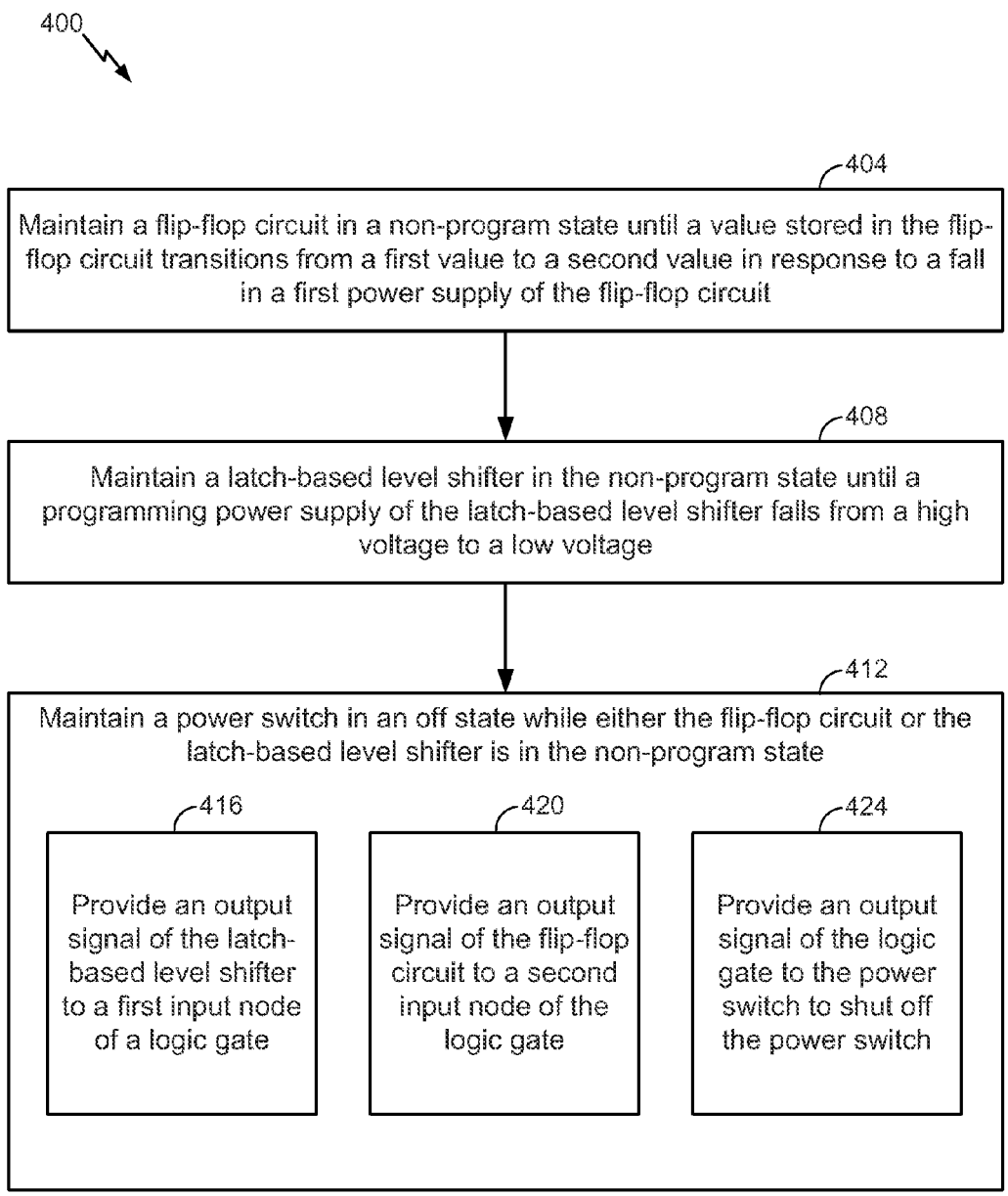
FIG. 4 depicts a flow diagram of a particular illustrative embodiment of a method of maintaining an OTP memory circuit, such as the OTP memory circuit of FIG. 1, in a non-program state during a power-down event of a circuit that includes the OTP memory circuit.

Referring to FIG. 4, a flow diagram 400 depicts a particular illustrative embodiment of a method of maintaining an OTP memory circuit in a non-program state during a power-down event of a circuit that includes the OTP memory circuit. The OTP memory circuit described with reference to the flow diagram 400 may be the OTP memory circuit 124 of FIGS. 1-2 or the OTP memory circuit 324 of FIG. 3.

A method illustrated by the flow diagram 400 includes maintaining a flip-flop circuit (e.g., the flip-flop circuit 316 of FIG. 3) in a non-program state until a value stored in the flip-flop circuit transitions from a first value to a second value (e.g., falls below a first threshold) in response to a fall in a first power supply (e.g., the first power supply 204 of FIG. 2) of the flip-flop circuit, at 404. For example, as described with reference to FIG. 3, a value stored in the flip-flop circuit 316 may fall from a first value to a second value in response to a fall in the first voltage 306 (e.g., during a power-down event).

A latch-based level shifter (e.g., the first latch-based level shifter 320 of FIG. 3) may be maintained in the non-program state until a programming power supply (e.g., the second power supply 208 of FIG. 2) of the latch-based level shifter falls from a high voltage to a low voltage (e.g., falls below a second threshold), at 408. For example, as described with reference to FIG. 3, the first latch-based level shifter 320 may remain in the non-program state while the second voltage 308 powers off. Maintaining the latch-based level shifter in the non-program state until the programming power supply safely powers down may prevent a program state from being accidentally entered, thus reducing accidental OTP memory operations.

A power switch (e.g., the global power switch 326 of FIG. 3) may be maintained in an off state (e.g., gated "off" via a logically high voltage) while either the flip-flop circuit or the latch-based level shifter is in the non-program state, at 412. Maintaining the power switch in the off state may include one or more of providing an output signal of the latch-based level shifter to a first input node of a logic gate (e.g., the first input node 321 of the NAND gate 322 of FIG. 3), at 416, providing an output signal of the flip-flop circuit to a second input node of the logic gate (e.g., the second input node 323 of the NAND gate 322 of FIG. 3), at 420, and providing an output signal of the logic gate to the power switch to shut off the power switch (e.g., providing the output signal of the NAND gate 322 to the global power switch 326 via the output node 325, as described with reference to FIG. 3), at 424. According to at least one alternate embodiment, the first voltage (instead of the output signal of the flip-flop circuit) is provided to the second input node of the logic gate.

The method described with reference to FIG. 4 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method described with reference to FIG. 4 can be performed by a processor (e.g., a digital signal processor, as described further with reference to FIG. 5) that executes instructions. For example, in at least one embodiment, a tangible computer readable medium stores instructions executable by a processor to cause the processor to maintain a flip-flop circuit (e.g., the flip-flop circuit 316 of FIG. 3) in a non-program state until a value stored in the flip-flop circuit transitions from a first value to a second value in response to a fall in a first power supply of the flip-flop circuit. A latch-based level shifter (e.g., the first latch-based level shifter 320 of FIG. 3) may be maintained in the non-program state until a programming power supply of the latch-based level shifter falls from a high voltage to a low voltage. A power switch (e.g., the global power switch 326 of FIG. 3) may be maintained in an off state while either the flip-flop circuit or the latch-based level shifter is in the non-program state. The processor may be coupled to a one-time programmable (OTP) memory circuit (e.g., the OTP memory circuit 326 of FIG. 3) that includes the flip-flop circuit, the latch-based level shifter, and the power-switch. According to a particular illustrative embodiment, the processor is integrated within a device selected from the group consisting of a set top box, a music player, a video player, an entertainment unit, a navigation device, a communications device, a personal digital assistant (PDA), a fixed location data unit, and a computer.

Figure 5:
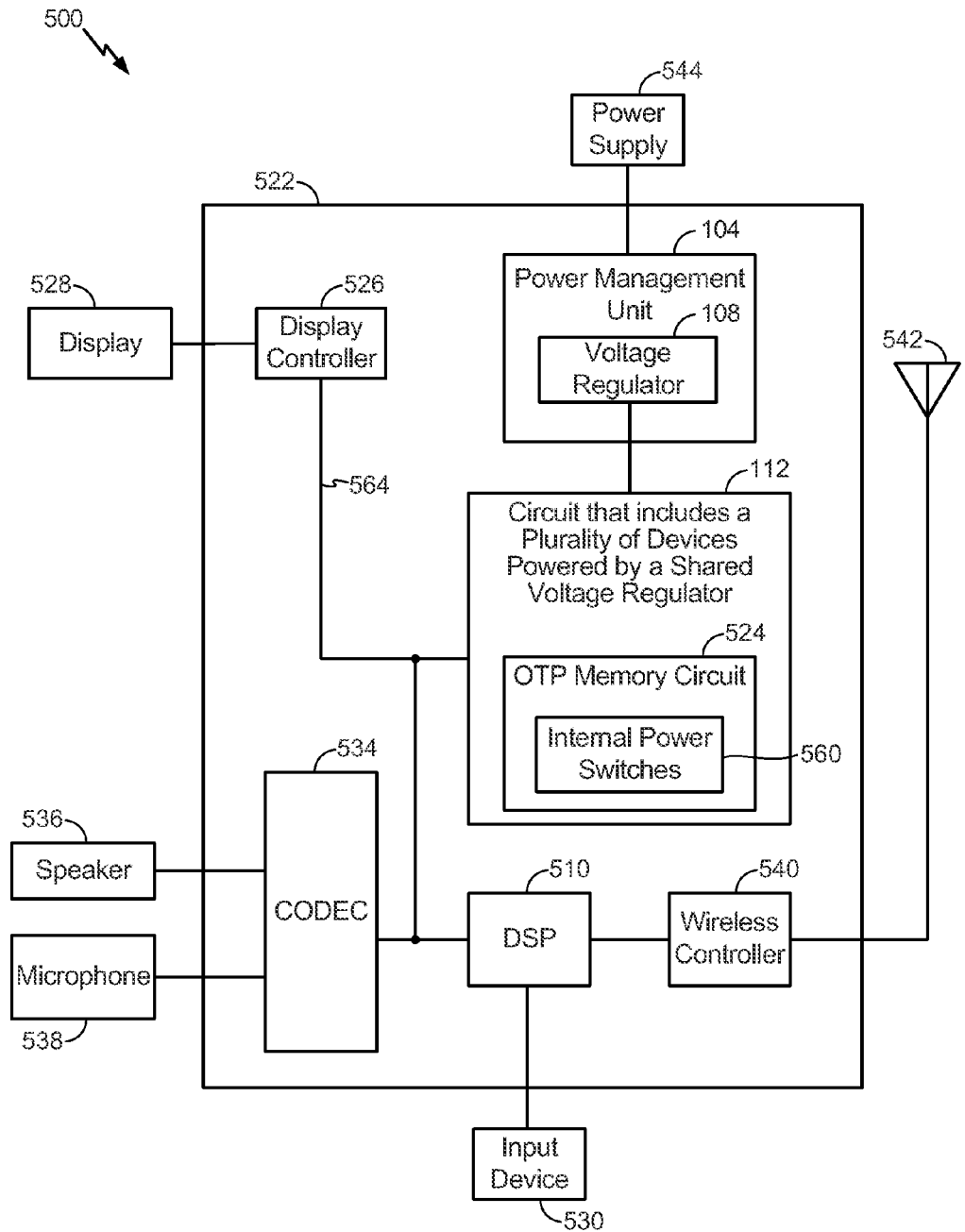
FIG. 5 depicts a block diagram of a device that includes an OTP memory circuit, such as the OTP memory circuit of FIG. 1.

Referring to FIG. 5, a block diagram of a particular illustrative embodiment of a device is depicted and generally designated 500. In the particular illustrative embodiment depicted in FIG. 5, the device 500 is a wireless communication device. According to alternate embodiments, the device 500 may be a set top box, a music player, a video player, an entertainment unit, a navigation device, a personal digital assistant (PDA), a fixed location data unit, or a computer.

The device 500 includes a processor, such as a digital signal processor (DSP) 510. The device 500 further includes a circuit 112, such as the circuit 112 of FIG. 1, which includes a plurality of devices, such as an OTP memory circuit 524, which may be the OTP memory circuit 124 of FIGS. 1-2 or the OTP memory circuit 324 of FIG. 3 and which may operate in accordance with the exemplary operation described with reference to the flow diagram 400 of FIG. 4.

Each of the plurality of devices of the circuit 112 may be configured to be powered by a shared voltage regulator, such as a voltage regulator 108 included in a power management unit 104, which may be the voltage regulator 108 of FIG. 1 and the power management unit 104 of FIG. 1, respectively. The OTP memory circuit 524 includes multiple internal power switches, such as internal power switches 560, which may include any of the first power switch 240 of FIG. 2, the second power switch 244 of FIG. 2, the kth power switch 248 of FIG. 2, the global power switch 326 of FIG. 3, and the local power switch 328 of FIG. 3.

FIG. 5 also shows a display controller 526 that is coupled to the digital signal processor 510 and to a display 528. A coder/decoder (CODEC) 534 may also be coupled to the digital signal processor 510. A speaker 536 and a microphone 538 may be coupled to the CODEC 534.

FIG. 5 also depicts that a wireless controller 540 can be coupled to the digital signal processor 510 and to a wireless antenna 542. The device 500 may further include an input device 530. The power management unit may receive power from a power supply 544.

Components of the device 500 may be communicatively coupled via a suitable bus or other structure. For example, FIG. 5 depicts an exemplary bus 564 communicatively coupling the display controller 526, the circuit 112, the CODEC 534, and the digital signal processor 510.

Any of the power management unit 104, the circuit 112, the digital signal processor 510, the display controller 526, the CODEC 534, and the wireless controller 540 may be included in a system-in-package or system-on-chip device 522. Moreover, in a particular embodiment and as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

In conjunction with the described embodiments, an apparatus is disclosed that includes a one-time programmable (OTP) memory circuit (e.g., the OTP memory circuit 124 of any of FIGS. 1-2, the OTP memory circuit 324 of FIG. 3, the OTP memory circuit 524 of FIG. 5, or an OTP memory circuit configured to operate in accordance with the exemplary operation described with reference to the flow diagram 400 of FIG. 4). The OTP memory circuit may be responsive to (or configured to be responsive to) a programming voltage (e.g., the second voltage 308 of FIG. 3). The OTP memory circuit may include an OTP memory array (e.g., the OTP memory array 220 of any of FIGS. 2 and 3) including OTP memory cells (such as the first OTP memory cell 224, the second OTP memory cell 228, the third OTP memory cell 232, and the nth OTP memory cell 236 of FIG. 2). The OTP memory circuit may further include means (e.g., any of the first power switch 240 of FIG. 2 and the global power switch 326 of FIG. 3) for decoupling the OTP memory array from the programming voltage, and means (e.g., any of the second power switch 244 of FIG. 2, the kth power switch 248 of FIG. 2, and the local power switch 328 of FIG. 3) for decoupling a subset of the OTP memory cells from the programming voltage. In a particular illustrative embodiment, the subset of the OTP memory cells is a column of the OTP memory cells. The apparatus may further include means for selecting the column of the OTP memory cells (e.g., a word line of the OTP memory circuit, such as the word line 352 of FIG. 3), means for generating the programming voltage (e.g., any of the voltage regulator 108 of FIG. 1, the second power supply 208 of FIG. 2, and the voltage regulator 108 of FIG. 5), and at least a second circuit responsive to the programming voltage (e.g., a device of the circuit 112 of FIG. 1 or 5). The apparatus may further include a device selected from a set top box, a music player, a video player, an entertainment unit, a navigation device, a communications device, a personal digital assistant (PDA), a fixed location data unit, and a computer, into which the OTP memory circuit is integrated. The apparatus may further include at least one semiconductor die into which the OTP memory circuit is integrated.

Figure 6:
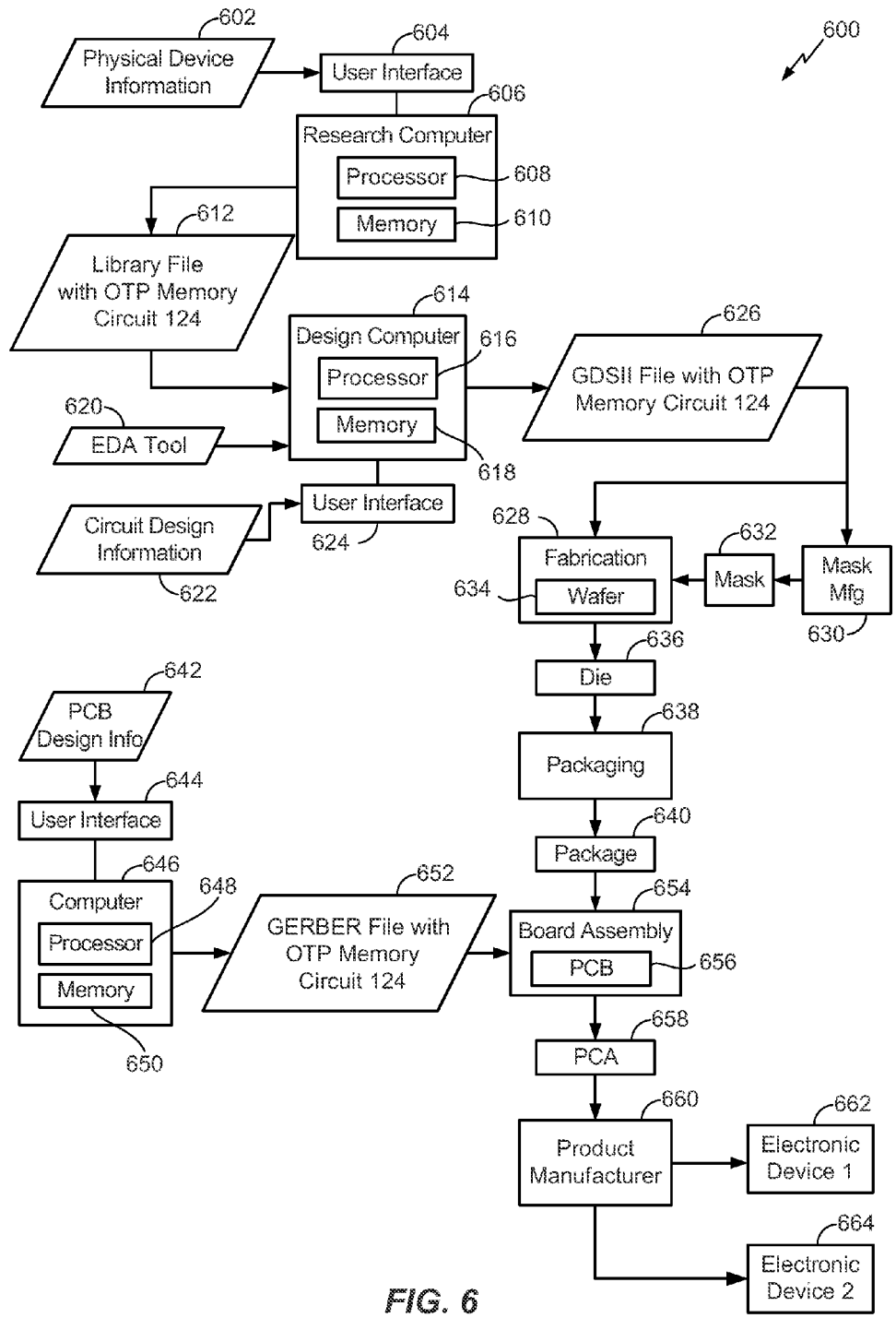
FIG. 6 is a data flow diagram of a particular illustrative embodiment of a manufacturing process to manufacture electronic devices that include an OTP memory circuit, such as the OTP memory circuit of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices such as described above. FIG. 6 depicts a particular illustrative embodiment of an electronic device manufacturing process 600.

Referring to FIG. 6, physical device information 602 is received at the manufacturing process 600, such as at a research computer 606. The physical device information 602 may include design information representing at least one physical property of a semiconductor device, such as the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium, such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof, of the library file 612. For example, a user of the design computer 614 may enter circuit design information 622 via a user interface 624 coupled to the design computer 614. The circuit design information 622 may include design information representing at least one physical property of a semiconductor device, such as the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof, in addition to other circuits or information. To illustrate, the data file may include information corresponding to a system-on-chip (SOC) that includes the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof, and that also includes additional electronic circuits and components within the SOC.

The GDSII file 626 may be received at a fabrication process 628 to manufacture the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658. For example, the PCA 658 may be the circuit 112 of FIG. 1 or the circuit 112 of FIG. 5.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer, into which is integrated the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units, the disclosure is not limited to these illustrated units. Embodiments of the disclosure may be suitably employed in any device which includes active integrated circuitry including memory and on-chip circuitry.

A device that includes the OTP memory circuit 124 of any of FIGS. 1-2, the OTP memory circuit 324 of FIG. 3, the OTP memory circuit 524 of FIG. 5, an OTP memory circuit configured to operate in accordance with the method described with reference to FIG. 4, or any combination thereof, may be fabricated, processed, and incorporated into an electronic device, as described in the illustrative process 600. One or more aspects of the embodiments disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and method steps described in connection with the embodiments disclosed herein may be implemented as electronic hardware, instructions stored on a tangible computer readable medium and to be executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure. In addition, while the foregoing embodiments have been described primarily in terms of a one-time programmable (OTP) memory circuit, those of skill in the art will recognize that the described functionalities may have applicability to a variety of circuits and devices in addition to OTP circuits.

The steps of various methods or processes described in connection with the embodiments disclosed herein may be embodied directly in hardware, in instructions executed by a processor, or in a combination of the two. Instructions to be executed by a processor may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
  a one-time programmable (OTP) memory circuit configured to be responsive to
    a programming voltage, the OTP memory circuit comprising:
    an OTP memory array comprising OTP memory cells;
    a first power switch configured to decouple the OTP memory array from the programming voltage; and
    a second power switch configured to decouple a subset of the OTP memory cells from the programming voltage.

2. The apparatus of claim 1, wherein the OTP memory circuit is further configured to remain in a non-program state in response to a power-down event.

3. The apparatus of claim 1, further comprising:
a voltage regulator configured to generate the programming voltage; and
a plurality of devices comprising the OTP memory circuit and at least one other device, the plurality of devices coupled to and configured to share the voltage regulator, wherein the OTP memory circuit is configured to remain in a non-program state during a power-down event.

4. The apparatus of claim 3, wherein the programming voltage is a voltage associated with determining bit values of the OTP memory cells.

5. The apparatus of claim 4, wherein the voltage regulator is a default-on, low-dropout (LDO) regulator.

6. The apparatus of claim 3, further comprising:
a flip-flop circuit;
a latch-based level shifter; and
a logic gate.

7. The apparatus of claim 6, wherein the logic gate is a NAND gate.

8. The apparatus of claim 6, wherein the first power switch comprises a first p-type field effect transistor (PFET).

9. The apparatus of claim 6, wherein a first power supply is coupled to the flip-flop circuit and to the latch-based level shifter,
wherein a second power supply from the voltage regulator is coupled to the latch-based level shifter, to the logic gate, and to the first power switch,
wherein an output of the flip-flop circuit is coupled to an input of the latch-based level shifter,
wherein the output of the flip-flop circuit is coupled to a first input of the logic gate,
wherein an output of the latch-based level shifter is coupled to a second input of the logic gate, and
wherein an output of the logic gate is coupled to the first power switch.

10. The apparatus of claim 9, wherein the second power supply is configured to generate the programming voltage.

11. The apparatus of claim 9, further comprising:
a second latch-based level shifter;
a logic block; and
an inverter,
wherein the second latch-based level shifter is coupled to the first power supply and to a third power supply,
wherein an output of the second latch-based level shifter is coupled to the logic block,
wherein the third power supply is coupled to the logic block,
wherein an output of the logic block is coupled to the inverter,
wherein an output of the inverter is coupled to the second power switch, and
wherein the second power switch is coupled to at least one of the OTP memory cells.

12. The apparatus of claim 11, further comprising an access transistor configured to couple a word line to the at least one OTP memory cell.

13. The apparatus of claim 11, wherein the second power switch comprises a second p-type field effect transistor (PFET).

14. The apparatus of claim 1, wherein the OTP memory circuit is integrated in at least one semiconductor die.

15. The apparatus of claim 14, further comprising a device selected from the group consisting of a set top box, a music player, a video player, an entertainment unit, a navigation device, a communications device, a personal digital assistant (PDA), a fixed location data unit, and a computer, into which an integrated circuit that comprises the at least one semiconductor die is integrated.

16. A method of maintaining a one-time programmable (OTP) memory circuit in a non-program state during a power-down event of a circuit that comprises the OTP memory circuit, the method comprising:
maintaining a flip-flop circuit in the non-program state until a value stored in the flip-flop circuit transitions from a first value to a second value in response to a fall in a first power supply of the flip-flop circuit; and
maintaining a latch-based level shifter in the non-program state until a programming power supply of the latch-based level shifter falls from a high voltage to a low voltage,
wherein a power switch is maintained in an off state while either the flip-flop circuit or the latch-based level shifter is in the non-program state.

17. The method of claim 16, further comprising:
providing an output signal of the latch-based level shifter to a first input node of a logic gate;
providing an output signal of the flip-flop circuit to a second input node of the logic gate; and
providing an output signal of the logic gate to the power switch to shut off the power switch.

18. The method of claim 16, wherein a voltage regulator is shared by a plurality of devices of the circuit, the plurality of devices comprising the OTP memory circuit.

19. The method of claim 16, wherein the circuit is incorporated into one of a set top box, a music player, a video player, an entertainment unit, a navigation device, a communications device, a personal digital assistant (PDA), a fixed location data unit, and a computer.

20. An apparatus comprising:
a one-time programmable (OTP) memory circuit configured to be responsive to a programming voltage, the OTP memory circuit comprising:
an OTP memory array comprising OTP memory cells;
means for decoupling the OTP memory array from the programming voltage; and
means for decoupling a subset of the OTP memory cells from the programming voltage.

21. The apparatus of claim 20, wherein the subset of the OTP memory cells is a column of the OTP memory cells.

22. The apparatus of claim 21, further comprising means for selecting the column of the OTP memory cells.

23. The apparatus of claim 22, wherein the means for selecting the column comprises a word line of the OTP memory circuit.

24. The apparatus of claim 20, wherein the means for decoupling the OTP memory array comprises a first power switch, and wherein the means for decoupling the subset of the OTP memory cells comprises a second power switch.

25. The apparatus of claim 20, wherein at least one of the means for globally decoupling and the means for locally decoupling is configured to remain in a non-program state during a power-down event.

26. The apparatus of claim 20, further comprising:
means for generating the programming voltage; and
at least a second circuit responsive to the programming voltage.

27. The apparatus of claim 26, wherein the means for generating the programming voltage comprises a default-on, low-dropout regulator.

28. The apparatus of claim 20, further comprising a device selected from the group consisting of a set top box, a music player, a video player, an entertainment unit, a navigation device, a communications device, a personal digital assistant (PDA), a fixed location data unit, and a computer, into which the OTP memory circuit is integrated.

29. The apparatus of claim 20, further comprising at least one semiconductor die into which the OTP memory circuit is integrated.

30. A method comprising:
receiving design information representing at least one physical property of a semiconductor device, the semiconductor device comprising:
a one-time programmable (OTP) memory circuit configured to be responsive to a programming voltage, the OTP memory circuit comprising:
an OTP memory array comprising OTP memory cells;
a first power switch configured to decouple the OTP memory array from the programming voltage; and
a second power switch configured to decouple a subset of the OTP memory cells from the programming voltage;
transforming the design information to comply with a file format; and
generating a data file including the transformed design information.

31. The method of claim 30, wherein the data file includes a GDSII format.

32. A method comprising:
receiving a data file comprising design information corresponding to a semiconductor device; and
fabricating the semiconductor device according to the design information, wherein the semiconductor device comprises:
a one-time programmable (OTP) memory circuit configured to be responsive to a programming voltage, the OTP memory circuit comprising:
an OTP memory array comprising OTP memory cells;
a first power switch configured to decouple the OTP memory array from the programming voltage; and
a second power switch configured to decouple a subset of the OTP memory cells from the programming voltage.

33. The method of claim 32, wherein the data file has a GDSII format.

34. A method comprising:
receiving design information comprising physical positioning information of a packaged semiconductor device on a circuit board, the packaged semiconductor device comprising:
a one-time programmable (OTP) memory circuit configured to be responsive to a programming voltage, the OTP memory circuit comprising:
an OTP memory array comprising OTP memory cells;
a first power switch configured to decouple the OTP memory array from the programming voltage; and
a second power switch configured to decouple a subset of the OTP memory cells from the programming voltage; and
transforming the design information to generate a data file.

35. The method of claim 34, wherein the data file has a GERBER format.

36. A method comprising:
receiving a data file comprising design information comprising physical positioning information of a packaged semiconductor device on a circuit board; and
manufacturing the circuit board configured to receive the packaged semiconductor device according to the design information, wherein the packaged semiconductor device comprises:
a one-time programmable (OTP) memory circuit configured to be responsive to a programming voltage, the OTP memory circuit comprising:
an OTP memory array comprising OTP memory cells;
a first power switch configured to decouple the OTP memory array from the programming voltage; and
a second power switch configured to decouple a subset of the OTP memory cells from the programming voltage.

37. The method of claim 36, wherein the data file has a GERBER format.

38. The method of claim 36, further comprising integrating the circuit board into a device selected from the group consisting of a set top box, a music player, a video player, an entertainment unit, a navigation device, a communications device, a personal digital assistant (PDA), a fixed location data unit, and a computer.

39. A tangible computer readable medium storing instructions executable by a processor to cause the processor to maintain a flip-flop circuit in a non-program state until a value stored in the flip-flop circuit transitions from a first value to a second value in response to a fall in a first power supply of the flip-flop circuit, wherein a latch-based level shifter is maintained in the non-program state until a programming power supply of the latch-based level shifter falls from a high voltage to a low voltage, and wherein the processor is coupled to a one-time programmable (OTP) memory circuit that includes the flip-flop circuit, the latch-based level shifter, and the power-switch.

40. The tangible computer readable medium of claim 39, wherein the processor is integrated within a device selected from the group consisting of a set top box, a music player, a video player, an entertainment unit, a navigation device, a communications device, a personal digital assistant (PDA), a fixed location data unit, and a computer.

* * * * *